(12) United States Patent
Gachter et al.

(10) Patent No.: US 11,486,503 B2
(45) Date of Patent: Nov. 1, 2022

(54) ASSEMBLY HAVING AT LEAST TWO CHAMBERS AND AT LEAST ONE TRANSFER VALVE

(71) Applicant: VAT Holding AG, Haag (CH)

(72) Inventors: Dominik Gachter, Gams (CH); Oliver Mahr, Schlins (AT)

(73) Assignee: VAT Holding AG, Haag (CH)

( * ) Notice: Subject to any disclaimer, the term of this patent is extended or adjusted under 35 U.S.C. 154(b) by 0 days.

(21) Appl. No.: 17/264,354

(22) PCT Filed: Jul. 9, 2019

(86) PCT No.: PCT/EP2019/068354
§ 371 (c)(1),
(2) Date: Jan. 29, 2021

(87) PCT Pub. No.: WO2020/035219
PCT Pub. Date: Feb. 20, 2020

(65) Prior Publication Data
US 2021/0293339 A1 Sep. 23, 2021

(30) Foreign Application Priority Data
Aug. 17, 2018 (AT) .................................. A 250/2018

(51) Int. Cl.
*F16K 11/20* (2006.01)
*F16K 27/04* (2006.01)
*F16K 51/02* (2006.01)

(52) U.S. Cl.
CPC ............ *F16K 11/20* (2013.01); *F16K 27/044* (2013.01); *F16K 51/02* (2013.01)

(58) Field of Classification Search
CPC ...... F16K 51/02; F16K 27/044; F16K 27/045; F16K 27/047; F16K 11/20; F16K 3/029
See application file for complete search history.

(56) References Cited

U.S. PATENT DOCUMENTS 4,675,096 A * 6/1987 Tateishi ................ C23C 14/568
204/192.12
5,909,867 A 6/1999 Blecha
(Continued)

FOREIGN PATENT DOCUMENTS

| CN | 107407427 | 11/2017 |
| EP | 2876341 | 5/2015 |

(Continued)

OTHER PUBLICATIONS

Chinese search report of Application No. 2019800539836; dated Aug. 22, 2022.

*Primary Examiner* — Hailey K. Do
(74) *Attorney, Agent, or Firm* — Volpe Koenig

(57) ABSTRACT

An assembly having at least two chambers (1, 2) and at least one transfer valve (3), wherein: a valve housing interior (9) of the transfer valve (3) is separated from each the chamber interiors (4, 5) of the chambers (1, 2) by respective partitions (12, 13) and a transfer opening (14, 15) for the feeding through of objects and/or fluids is formed in each of the partitions (12, 13) and in addition to the transfer opening (14, 15) in question an additional opening (16, 17) is arranged in each of the partitions (12, 13). The additional openings (16, 17) can be closed by respective switching valves (18, 19) of the assembly and, in an open state of the respective switching valves (18, 19), directly fluidically connect the valve housing interior (9) to the respective chamber interiors (4, 5) adjoining the respective partitions (12, 13).

11 Claims, 3 Drawing Sheets

(56) References Cited

U.S. PATENT DOCUMENTS

| | | | | |
|---|---|---|---|---|
| 6,113,749 A | * | 9/2000 | Kok | C23C 14/568 |
| | | | | 204/192.12 |
| 2005/0045235 A1 | | 3/2005 | Kajitani | |
| 2012/0247564 A1 | * | 10/2012 | Kho | F16K 3/188 |
| | | | | 251/318 |
| 2013/0004267 A1 | * | 1/2013 | Tateshita | F16K 3/184 |
| | | | | 414/217 |
| 2015/0136236 A1 | | 5/2015 | Bachmann et al. | |
| 2016/0084389 A1 | * | 3/2016 | Wakabayashi | F16K 3/0218 |
| | | | | 137/625.48 |

FOREIGN PATENT DOCUMENTS

| | | |
|---|---|---|
| GB | 252863 | 6/1926 |
| GB | 1192164 | 5/1970 |
| JP | 2001324032 | 11/2001 |
| JP | 2005076845 | 3/2005 |
| JP | 2008185160 | 8/2008 |
| JP | 2016011719 | 1/2016 |
| KR | 101353019 | 1/2014 |

\* cited by examiner

ASSEMBLY HAVING AT LEAST TWO CHAMBERS AND AT LEAST ONE TRANSFER VALVE

TECHNICAL FIELD

The present invention relates to an arrangement having at least two chambers and having at least one transfer valve, wherein the chambers each have a chamber interior and a chamber housing which encloses the chamber interior, and the transfer valve has at least one transfer valve housing with a valve housing interior and has two transfer valve closure members, wherein the valve housing interior is separated from each of the chamber interiors by respectively one separating wall, and in each of the separating walls a transfer opening is formed, wherein, in an open position of the transfer valve closure members of the transfer valve, objects and/or fluids are able to be transported, through the transfer openings and the valve housing interior, from one of the chamber interiors into the other one of the chamber interiors, and each of the transfer valve closure members closes one of the transfer openings in its closed position.

BACKGROUND

Such arrangements of chambers with interposed transfer valves are known per se. They are often used in negative-pressure or vacuum technology. The chambers may be both process chambers and transfer chambers. The transfer valves make it possible for the transfer openings to be closed off. If the transfer valve closure members of the transfer valve are in the open position, then objects and/or fluids can be transported through the transfer opening into the respective chamber and removed therefrom. Generic prior art is presented in EP 2 876 341 B1. There, a description is also given of how the chamber interiors and also the valve housing interior of the respective transfer valve are pumped out, that is to say subjected to negative pressure or vacuum, and how these chamber interiors and the valve housing interior are aerated, and thereby subjected to pressure, again. In EP 2 876 341 B1, it is already proposed that, for pumping out and also for aerating the valve housing interior, no separate suction pumps and inlet valves at the transfer valve be provided. In EP 2 876 341 B1, it is rather the case that a branched-off line is led from one of the suction pumps of the chamber to the transfer valve in order for both the chamber interior and the valve housing interior to be able to be pumped out by way of this one suction pump.

In EP 2 876 341 B1, it is described in particular in the patent claim 1 thereof how a positive pressure in one of the chamber interiors in relation to the valve housing interior may be used to lift the transfer valve closure member off from the respective valve seat in order, in this way, to initiate the opening process for opening up the transfer opening. In order to make available the required pressure difference between chamber interior and valve housing interior, use is made of the connecting line between the suction pump of the chamber and the transfer valve housing or the valve housing interior in EP 2 876 341 B1.

In practice, said connecting line is also used to compensate for differential pressures between the chamber interiors and the valve housing interior in order for it then to be possible for the transfer valve to be opened by means of corresponding drives.

It has been shown in practice that the technology described in EP 2 876 341 B1, in particular in the case of chambers and transfer valve housings with relatively large interiors, leads to very long switching times or, in part, completely reaches its limits of feasibility.

SUMMARY

It is an object of the invention to provide an improvement for solving this problem.

The invention, proceeding from the generic prior art, provides for this purpose that, in each of the separating walls there is arranged, in addition to the respective transfer opening, respectively one auxiliary opening, wherein the respective auxiliary opening is respectively able to be closed off by a switching valve of the arrangement and, in an open state of the respective switching valve, connects the valve housing interior, respectively directly in a fluid-conducting manner, to the chamber interior which is adjacent to the respective separating wall.

In other words, according to the invention, it is provided for there to be provided directly in the separating walls, which separate the respective chamber interior from the valve housing interior, in addition to the transfer opening, respectively one auxiliary opening. This auxiliary opening may then have in a simple way an opening diameter of corresponding size or an opening area of corresponding size, with the result that fluids, and in particular gases, can be transported through in relatively large quantities relatively quickly. In this way, pressure equalization between the respective chamber interior and the valve housing interior can be made possible very quickly. Also, the pumping-out of the valve housing interior via a suction pump connected to the chamber interior can take place very quickly. Due to the auxiliary openings in the respective separating wall, lines or conduits between the respective suction pump and the transfer valve housing or the valve housing interior can be completely dispensed with, so that also the problems brought about by these lines and their maximum possible line cross sections in the prior art with regard to the excessively long switching times, and also to the technological limits, for relatively large volumes of the chamber interiors and of the valve housing interiors are eliminated.

In other words, with the invention, it is thus provided that, with an open switching valve, the valve housing interior is connected exclusively and directly via the auxiliary opening to the respective chamber interior, with the result that piping, in this regard, can be completely dispensed with.

For the sake of completeness, it is pointed out that, unless indicated otherwise, indefinite articles such as a or an can be read as meaning at least one, that is to say as meaning a/an/one or more. The same applies to indicated quantities such as two, three, etc. The stated components of the arrangement may therefore be provided in the respectively stated number multiple times as well.

The respective separating wall, which respectively separates one of the chamber interiors from the valve housing interior, may consist exclusively of a sub-region of the respective chamber housing or, however, also exclusively of a sub-region of the respective transfer valve housing. The separating wall may however also be made up of multiple walls. It is thus a possibility for example that the separating wall is made up of mutually abutting sub-regions of the respective chamber housing and of the transfer valve housing. In other words, in these cases, the separating wall is formed by two mutually abutting walls, specifically the wall of the chamber housing, on the one hand, and the wall of the transfer valve housing, on the other hand. Generally speaking, it may consequently be provided that the respective separating wall is formed from a sub-region of the respective chamber housing or from a sub-region of the transfer valve housing or from mutually abutting sub-regions of the respective chamber housing and of the transfer valve housing.

Preferred variants provide that the respective switching valve is arranged at least regionally in the respective separating wall. This applies particularly preferably to the respective switching valve closure member. It is consequently preferably provided that the switching valve closure member of the respective switching valve, for closing off the respective auxiliary opening, is arranged at least regionally, or else completely, in the respective separating wall. The valve drive of the switching valve, for moving the switching valve closure member, may also be arranged outside the respective separating wall. Preferably, it is also provided that a valve seat of the respective switching valve, against which the or a switching valve closure member of the respective switching valve, for closing off the respective auxiliary opening, is able to be pressed, is arranged on or in the separating wall.

Within the context of making possible the quickest possible pressure equalization and the quickest possible pumping-out, and also of the usability of corresponding transfer valves, in the case of relatively large chamber volumes, it is expediently provided that the respective auxiliary opening, in an open state of the respective switching valve, has an opening diameter of at least 100 mm (millimeters). Particularly preferably, the auxiliary openings have a circular cross section here. Expressed in terms of area, it is expediently provided that the respective auxiliary opening, in an open state of the respective switching valve, has an opening area of at least 7850 $mm^2$ (square millimeters). It goes without saying that it is not absolutely necessary for the auxiliary opening to have a circular opening cross section. Other geometries are possible too.

With the invention, an opening time and/or a closing time of the transfer valve is expediently less than or equal to 7 seconds, preferably less than or equal to 5 seconds. With the invention, an opening time and/or a closing time of the respective switching valve is expediently less than or equal to 2 seconds, preferably less than or equal to 1 second. Here, the opening time is respectively the time which the respective closure member requires from the completely closed position into the completely open position. The closing time is the time which the respective closure member requires from the completely open position into the completely closed position. Preferred variants of the invention provide that the transfer valve closure members are formed as closure plates. Also, the switching valve closure members are, in preferred configurations, preferably respectively formed as a closure plate.

In preferred variants, arrangements according to the invention respectively have at least one suction pump, which is connected, preferably directly, to the respective chamber and serves for pumping fluid out of the respective chamber interior. Preferably, it is also provided that the arrangement respectively has at least one inlet valve, which is connected, preferably directly, to the respective chamber and serves for admission of fluid into the respective chamber interior. The chambers may be both process chambers and transfer chambers.

Even though the arrangement according to the invention has until now been described in terms of its minimum arrangement with two chambers and with a transfer valve arranged therebetween, it should be pointed out that the arrangement according to the invention may also consist of multiple chambers arranged one behind the other or so as to be star-shaped or the like and transfer valves arranged respectively in an interposed manner, as is shown by way of example in EP 2 876 341 B1, mentioned in the introduction, in FIGS. 7 to 9. Thus, the smallest unit is described in the claims, which unit can be correspondingly reproduced multiple times in the realization of the invention. The chambers are preferably negative-pressure or vacuum chambers, in the chamber interior of which a corresponding negative pressure or a so-called vacuum can be generated by means of the respective suction pump in order to be able to carry out a corresponding process in the chamber interior. Here, reference is generally made to a vacuum or vacuum technology if operating states with pressures of less than or equal to 0.001 mbar (millibars) or 0.1 Pa (pascals) are attained in the chamber interior. In vacuum technology, the vacuum chambers and also the corresponding transfer valves are designed for these pressure ranges and/or corresponding pressure differences in relation to the surroundings or to atmospheric pressure. In a broad interpretation, however, reference could also be made to vacuum technology even for pressures as low as 1 bar below normal pressure.

One preferred method for operating a corresponding arrangement provides that, for pumping fluid out of the valve housing interior, one of the auxiliary openings is brought to the open state by means of the switching valve assigned here, and the fluid is pumped, through the auxiliary opening and the respective chamber interior, out of the valve housing interior by the suction pump connected to the respective chamber. In other words, according to the invention, with an open auxiliary opening, pumping-out through the auxiliary opening and the chamber is consequently realized for the valve housing interior by the suction pump assigned to the chamber. In this way, an extra suction pump for the valve housing interior and the sensor system required for this can be dispensed with. Owing to the arrangement according to the invention of the auxiliary opening in the separating wall between valve housing interior and chamber interior, correspondingly quick pumping-out is nevertheless possible even in the case of relatively large volumes.

In preferred methods, however, the auxiliary opening may also be used to bring about pressure equalization between the chamber interior and the valve housing interior in a very quick and complete manner. In this regard, preferred methods for operating an arrangement according to the invention provide that, for pressure equalization between one of the chamber interiors and the valve housing interior, the auxiliary opening arranged therebetween or in the respective separating wall is brought to the open state by means of the switching valve assigned thereto. Here, too, by way of the auxiliary opening in the separating wall, a very direct connection between chamber interior and valve housing interior is made possible, with the result that this pressure equalization can take place in a very quick and complete manner.

BRIEF DESCRIPTION OF THE DRAWINGS

Further features and details of preferred variants of the invention will be explained by way of example and schematically in the following description of the figures, in which.

DETAILED DESCRIPTION

Figure 1:
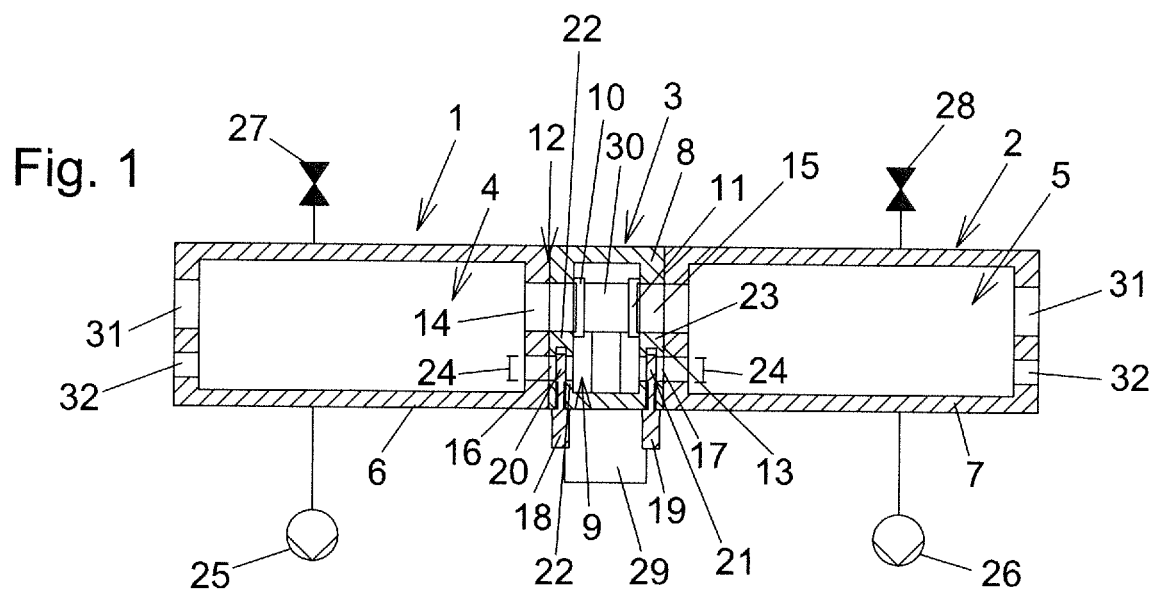
FIGS. 1 to 3 show schematic longitudinal sections through an arrangement according to the invention in a first exemplary embodiment, and FIGS. 4 to 7 each show a modification, likewise according to the invention, of said first exemplary embodiment as per FIGS. 1 to 3.
Figure 2:
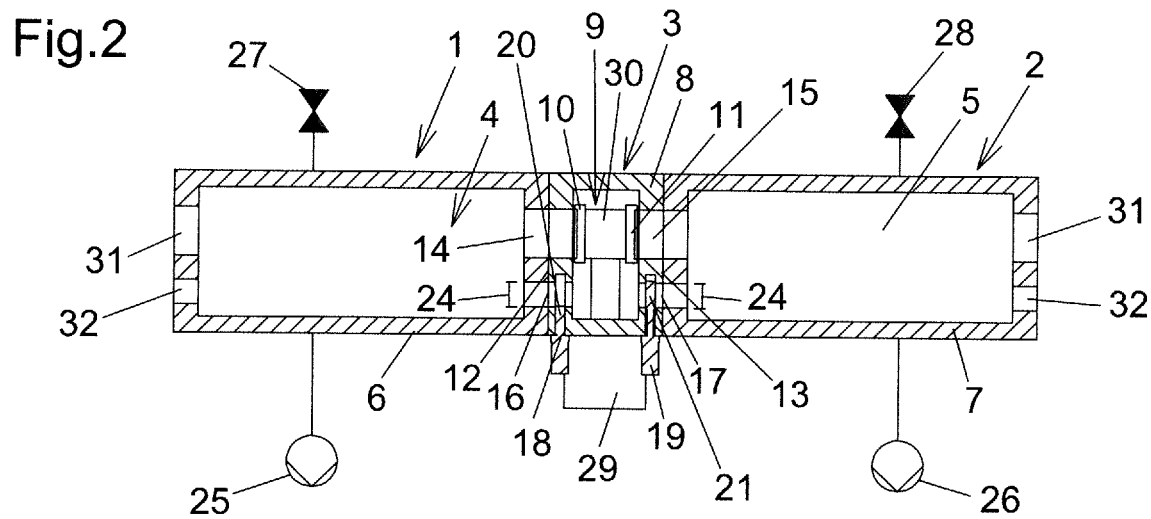
Figure 3:
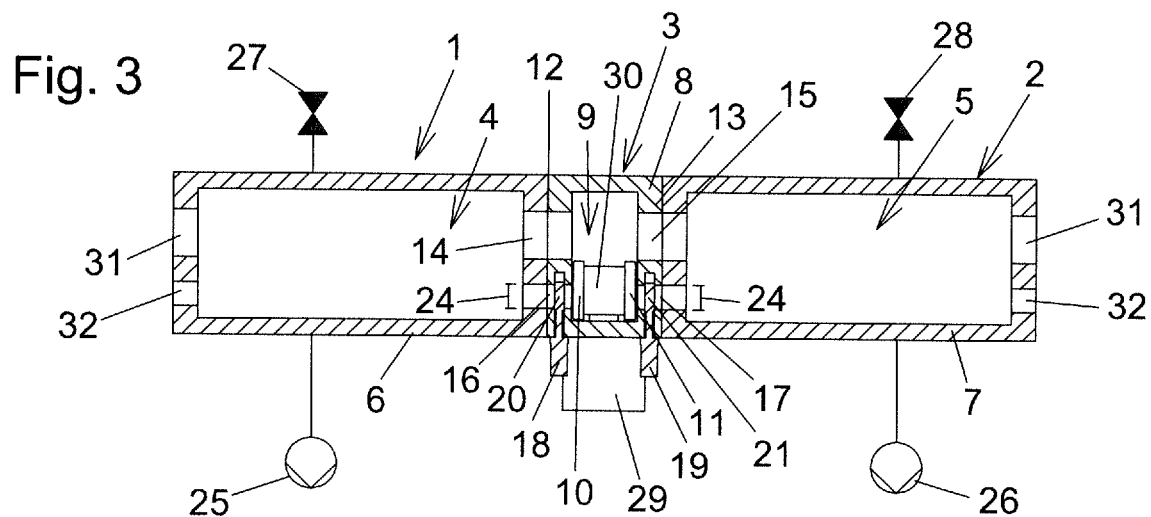

FIGS. 1 to 3 show respective sectional illustrations through the first exemplary embodiment of an arrangement according to the invention comprised of a chamber 1 and a chamber 2 and having a transfer valve 3 arranged therebetween. The chamber housing 6 of the chamber 1 encloses the chamber interior 4. The chamber housing 7 of the chamber 2 encloses the chamber interior 5. The transfer valve housing 8 encloses the valve housing interior 9, in which the transfer valve closure members 10 and 11 of the transfer valve 3 are situated. The transfer valve closure members 10 and 11 serve for closing off or opening up the transfer openings 14 and 15 arranged in the respective separating wall 12 and 13. In FIGS. 1 to 3, the transfer valve closure members 10 and 11 and the longitudinal drive 29 and the transverse drive 30 are illustrated merely highly schematically. With regard to said components, an L-valve known per se may be involved. The transverse drive 30 serves for pressing the transfer valve closure members 10 and 11, for closing off the transfer openings 14 and 15, against the valve seats (respectively not specifically shown here) of the transfer valve housing 8, as is illustrated in FIG. 1, and for lifting the transfer valve closure members 10 and 11 off from the respective valve seats of the transfer valve housing, with the result that an intermediate position is attained, this being indicated in FIG. 2. In said intermediate position, the transfer valve closure members 10 and 11 have already been lifted off from the respective valve seat, but still overlap the transfer openings 14 and 15. Between said intermediate position, as per FIG. 2, and the maximum open position, illustrated in FIG. 3, the transfer valve closure members 10 and 11 and the transverse drive 30 are adjustable back and forth by means of the longitudinal drive 29. There are a wide range of variants in the prior art for this purpose, which do not need to be mentioned specifically but can be utilized here. In the position as per FIG. 3, the open position of the transfer valve closure members 10 and 11 has at any rate been attained. In said open position, objects and/or fluids can be transported, through the transfer openings 14 and 15 and the valve housing interior 9, from one of the chamber interiors 4 and 5 into the respectively other one of the chamber interiors 4 and 5. By contrast, in the closed position as per FIG. 1, the transfer valve closure members 10 and 11 close off the transfer openings 14 and 15 with the respectively required pressure resistance.

Instead of the L-valve shown schematically here, the transfer valve 3 may also be designed as a pendulum valve, as a so-called Monovat valve, in the case of which the closure members are moved linearly back and forth between the open and closed positions in mutually opposite directions only, and also in other valve forms known per se.

Each of the chambers 1 and 2 is assigned respectively one suction pump 25 or 26 and respectively one inlet valve 27 or 28. It goes without saying that there may also be more suction pumps and more inlet valves per chamber. At any rate, the suction pump 25 serves for pumping fluid, and in particular gas, out of the chamber interior 4 of the chamber 1. The suction pump 26 is used for pumping corresponding fluid, and in particular gas, out of the chamber interior 5 of the chamber 2. This pumping process allows a corresponding negative pressure or a corresponding vacuum to be generated in the chamber interiors 4 and/or 5. For aeration, or for pressure equalization between the respective chamber interior 4 and 5 and the surroundings or other correspondingly connected pressure spaces or pressure levels, the inlet valves 27 and 28, as is known per se, are provided. If said inlet valves are opened, fluid can enter the respective chamber interior 4 and 5.

In all the exemplary embodiments, the arrangement according to the invention is shown in its minimum configuration, which consists precisely of two chambers 1 and 2 and a transfer valve 3 arranged therebetween. As already discussed in the introduction, arrangements according to the invention may however have a multiplicity of chambers connected to one another or arranged one behind the other and transfer valves arranged respectively between two chambers. This is indicated in FIGS. 1 to 3 by the further transfer openings 31 and also by the further auxiliary openings 32, to which a corresponding transfer valve 3 (not further illustrated here) can respectively be connected in order for further chambers to be arranged behind it or in front of it.

In the first exemplary embodiment as per FIGS. 1 to 3, the transfer opening 14 extends through the separating wall 12, with the result that, by way of the transfer opening 14, the chamber interior 4 of the chamber 1 is connected to the valve housing interior 9 in the transfer valve housing 8 when the transfer valve 3 is correspondingly open. This applies correspondingly to the transfer opening 15, which connects the chamber interior 5 of the chamber 2 to the valve housing interior 9 of the transfer valve housing 8 when the transfer valve 3 is correspondingly open. The separating wall 12 is consequently arranged between the chamber interior 4 and the valve housing interior 9. The separating wall 13 separates the chamber interior 5 from the valve housing interior 9. In the first exemplary embodiment, said separating walls 12 and 13 are formed from mutually abutting sub-regions of the respective chamber housing 6 or 7 and of the transfer valve housing 8. In other words, the respective separating wall 12 or 13 consists in this example of mutually abutting wall regions of the respective chamber housing 6 or 7 and of the transfer valve housing 8.

According to the invention, it is then provided that, in each of the separating walls 12 and 13, there is arranged, in addition to the respective transfer opening 14 or 15, respectively one auxiliary opening 16 or 17, wherein the respective auxiliary opening 16 or 17 is respectively able to be closed off by a switching valve 18 or 19 of the arrangement and, in an open state of the respective switching valve 18 or 19, connects the valve housing interior 9, respectively directly in a fluid-conducting manner, to the chamber interior 4 or 5 which is adjacent to the respective separating wall 12 or 13. Expediently, the opening diameter 24 of the respective auxiliary opening 16 or 17 is at least 100 mm in the open state. Based on the area of the respective auxiliary opening 16 and 17 in the open state, an opening or cross-sectional area of at least 7850 mm² is expediently provided. The respective auxiliary opening 16 or 17 may be in the form of a circular hole, or else may in principle have a different geometry.

The switching valves 18 and 19 are illustrated here merely highly schematically. When realizing the switching valves 18 and 19, it is in turn possible for use to be made of suitable valve types known per se in the prior art. The switching valves 18 and 19 may also be L-valves, pendulum valves, Monovat valves or the like. In preferred embodiment variants, it may, as shown in FIGS. 1 to 3, be provided that the respective switching valve 18 or 19 is arranged at least regionally in the respective separating wall 12 or 13. In the exemplary embodiment as per FIGS. 1 to 3 shown here, the switching valve closure members 20 and 21 of the respective switching valve are in particular in the closed state in the respective separating wall 12 and 13. The drives for moving the switching valve closure members 20 and 21 may, as also realized here, be arranged at least regionally outside the respective separating wall 12 and 13. It is at any rate expedient for the valve seats 22 and 23 of the respective switching valve 18 and 19, against which the respective switching valve closure member 20 and 21 of the respective switching valve 18 and 19, for closing off the respective auxiliary openings 16, 17, is able to be pressed, to be arranged on or in the respective separating wall 12 or 13. This, too, is the case in this exemplary embodiment as per FIGS. 1 to 3. Like the transfer valve closure members 10 and 11, the switching valve closure members 20 and 21 are expediently also respectively formed as a closure plate.

In FIG. 1, the switching valve closure members 20 and 21 of the switching valves 18 and 19 are each in their closed position, in which they close off the respective auxiliary opening 16 and 17 respectively in a correspondingly pressure-tight manner. The same applies to the situation as per FIG. 3. By contrast, in FIG. 2, the switching valve closure member 20 of the switching valve 18 is in its open position, and so the auxiliary opening 16 connects the chamber interior 4 of the chamber 1 to the valve housing interior 9 of the transfer valve housing 8. The other switching valve 19 is in its closed position, and so the switching valve closure member 21 still closes off the auxiliary opening 17 between the chamber interior 5 of the chamber 1 and the valve housing interior 9 of the transfer valve housing 8 in a pressure-tight manner. Fluid, and in particular gas, can be removed by suction, through the auxiliary opening 16 and the chamber interior 4, from the valve housing interior 9 through the open auxiliary opening 16, for example by means of the suction pump 25 of the chamber 1. Here, due to the arrangement of the auxiliary opening 16 directly in the separating wall 12, very rapid pumping-out, and also pumping-out of relatively large volumes, is possible, without time and pressure losses occurring as a result of the lines provided in the prior art. The pumping-out of the valve housing interior 9 may also be realized, by means of the suction pump 26, via the chamber interior 5 of the chamber 2 and the auxiliary opening 17 with a correspondingly closed auxiliary opening 16 and a correspondingly open auxiliary opening 17.

Additionally, the auxiliary openings 16 and 17 may also be used to very quickly establish, in the case of the chamber interiors 4 and/or 5 being flooded via the inlet valves 27 and 28, pressure equalization between the respective chamber interior 4 or 5 and the valve housing interior 9, or to compensate for residual differential pressures between these volumes.

It can be clearly seen in FIGS. 1 to 3 that, in this first exemplary embodiment, the switching valves 18 and 19 are arranged in the wall section of the respective separating wall 12 or 13 that is respectively part of the transfer valve housing 8.

Variants or alternatives for forming arrangements according to the invention will now be described by way of example below. The following descriptions in FIGS. 4 to 7 concentrate on the differences in relation to this first exemplary embodiment as per FIGS. 1 to 3, which has been described up until now. All the other details and functionings are not described separately again. In this regard, reference is made to the above descriptions of the first exemplary embodiment.

Figure 4:
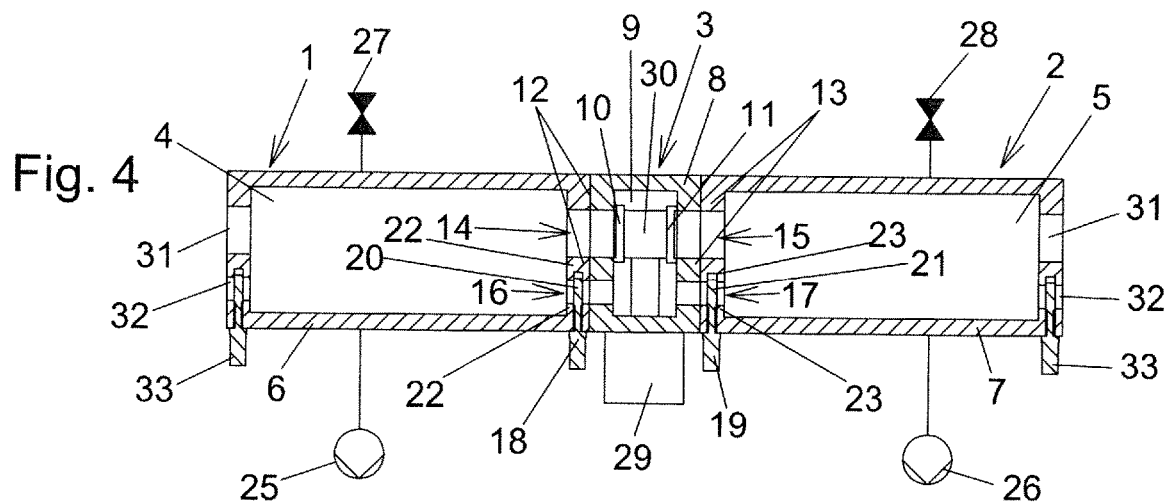

In the variant as per FIG. 4, the difference in relation to the first exemplary embodiment is that the switching valves 18 and 19 are arranged in the sub-region of the respective separating wall 12 or 13 that can be respectively associated with the chamber housing 6 or 7. Accordingly, in this exemplary embodiment, the further switching valves 33, by way of which the further auxiliary openings 32 can be opened up and closed off, are also shown. Consequently, in FIG. 4, the valve seats 22 and 23 for the respective closure member 20 and 21 of the respective switching valve 18 and 19 are arranged in the corresponding sub-region of the respective chamber housing 6 and 7 and thus in the respective separating wall 12 and 13.

Figure 5:
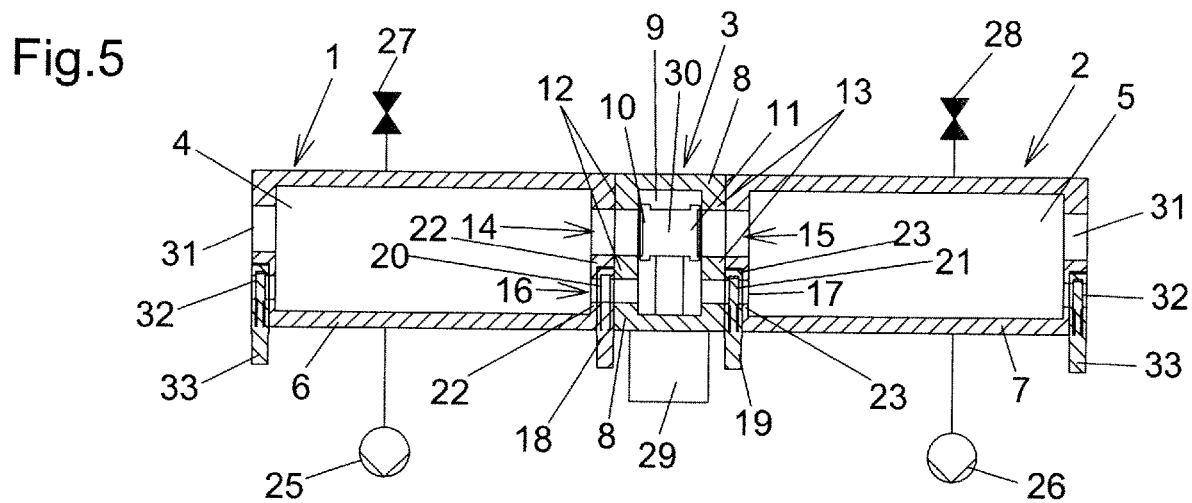

In FIG. 5, the switching valves 18 and 19 are arranged in the parting plane between the respective wall sections of the chamber housing 6 or 7 and of the transfer valve housing 8. In this embodiment variant, the switching valves 18 and 19 each have a separate housing, with the result that the valve seats 22 and 23 for the switching valve closure members 20 and 21, in this exemplary embodiment as per FIG. 5, are part of a separate housing of the respective switching valve 18 and 19. The same applies in turn for the further switching valves 33 also illustrated here.

Figure 6:
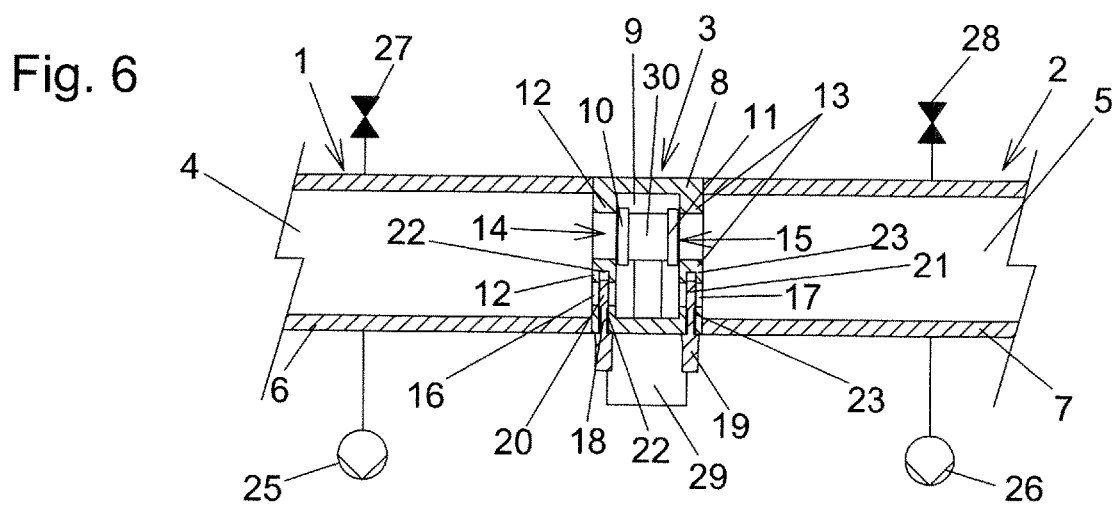

In the variant as per FIG. 6, the difference in relation to the first exemplary embodiment as per FIGS. 1 to 3 is that, here, the respective separating wall 12 or 13 respectively consists only and exclusively of a wall section of the transfer valve housing 8. Accordingly, the switching valves 18 and 19 are also arranged in the respective wall section of the transfer valve housing 8 that forms the separating wall 12 or 13. In this exemplary embodiment, the chamber housings 6 and 7 have no wall sections which form a sub-region of the respective separating wall 12 or 13. The illustrated wall regions of the chamber housings 6 and 7 are correspondingly connected directly to the transfer valve housing 8.

Figure 7:
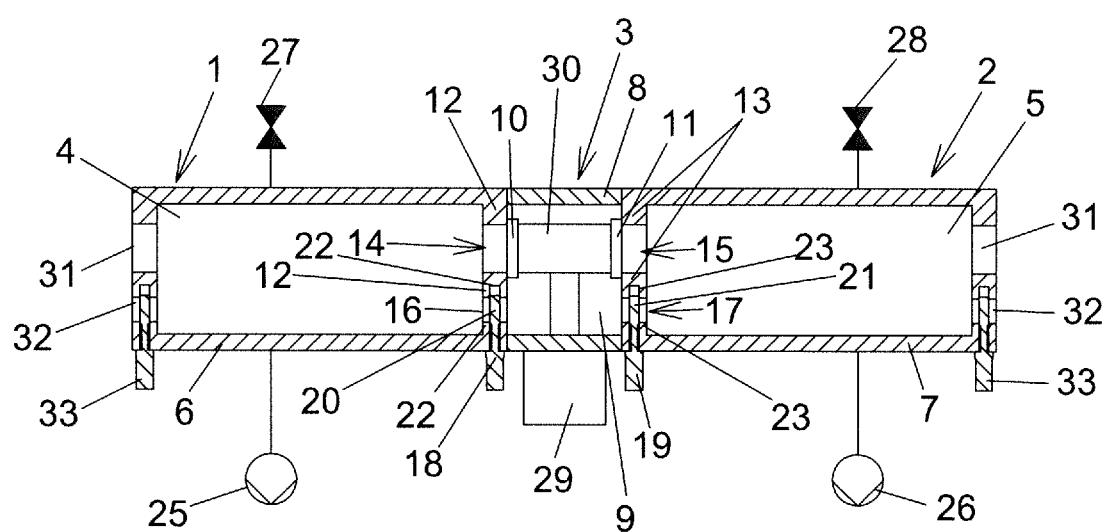

By contrast, in the variant as per FIG. 7, the transfer valve housing 8 has in the region of the separating walls 12 and 13 no separate wall sections. Here, the separating walls 12 and 13 are formed exclusively by corresponding wall sections of the respective chamber housing 6 and 7. Accordingly, the switching valves 18 and 19 and also the auxiliary openings 16 and 17 as well as the transfer openings 14 and 15 are arranged in the wall section of the chamber housing 6 and 7 that respectively forms the separating wall 12 or 13. Here, too, the further switching valves 33 are accordingly illustrated in turn.

KEY TO THE REFERENCE SIGNS

| | |
|---|---|
| 1 | Chamber |
| 2 | Chamber |
| 3 | Transfer valve |
| 4 | Chamber interior |
| 5 | Chamber interior |
| 6 | Chamber housing |
| 7 | Chamber housing |
| 8 | Transfer valve housing |
| 9 | Valve housing interior |
| 10 | Transfer valve closure member |
| 11 | Transfer valve closure member |
| 12 | Separating wall |
| 13 | Separating wall |
| 14 | Transfer opening |
| 15 | Transfer opening |
| 16 | Auxiliary opening |
| 17 | Auxiliary opening |
| 18 | Switching valve |
| 19 | Switching valve |
| 20 | Switching valve closure member |
| 21 | Switching valve closure member |
| 22 | Valve seat |

| 23 | Valve seat |
|---|---|
| 24 | Opening diameter |
| 25 | Suction pump |
| 26 | Suction pump |
| 27 | Inlet valve |
| 28 | Inlet valve |
| 29 | Longitudinal drive |
| 30 | Transverse drive |
| 31 | Further transfer opening |
| 32 | Further transfer opening |
| 33 | Further switching valve |

The invention claimed is:

1. An arrangement comprising:
at least two chambers;
a transfer valve;
the at least two chambers each have a chamber interior and a chamber housing which encloses the chamber interior;
the transfer valve has a transfer valve housing with a valve housing interior and has two transfer valve closure members;
separating walls, wherein the valve housing interior is separated from each of the chamber interiors by a respective one of the separating walls, and in each of the separating walls a transfer opening is formed;
wherein, in an open position of the two transfer valve closure members of the transfer valve, at least one of objects or fluids are able to be transported through each of the the transfer openings and the valve housing interior, from one of the chamber interiors into an other one of the chamber interiors, and each of the two transfer valve closure members closes a respective one of the transfer openings in a closed position thereof;
switching valves;
one respective auxiliary opening arranged in each of the separating walls, in addition to the respective transfer opening, each of the respective auxiliary openings is respectively configured to be closed off by a respective one of the switching valves and, in an open state of the respective switching valve, connects the valve housing interior, respectively directly in a fluid-conducting manner, to the chamber interior which is adjacent to the respective separating wall; and the respective switching valve is arranged at least regionally in the respective separating wall for closing off the respective auxiliary opening.

2. The arrangement as claimed in claim 1, wherein the respective separating wall is formed from a sub-region of the respective chamber housing or from a sub-region of the transfer valve housing or from mutually abutting sub-regions of the respective chamber housing and of the transfer valve housing.

3. The arrangement as claimed in claim 1, wherein the switching valves each include a respective switching valve closure member, and a valve seat of the respective switching valve, against which the respective switching valve closure member of the respective switching valve is adapted to be pressed for closing off the respective auxiliary opening, is arranged on or in the respective separating wall.

4. The arrangement as claimed in claim 1, wherein the respective auxiliary opening, in an open state of the respective switching valve, has at least one of an opening diameter of at least 100 mm or an opening area of at least 7850 mm2.

5. The arrangement as claimed in claim 1, wherein at least one of an opening time or a closing time of the transfer valve is less than or equal to 7 seconds.

6. The arrangement as claimed in claim 1, wherein at least one of an opening time or a closing time of the respective switching valve is less than or equal to 2 seconds.

7. The arrangement as claimed in claim 1, wherein at least one of the two transfer valve closure members of the transfer valve or a switching valve closure member is respectively formed as a closure plate.

8. The arrangement as claimed in claim 1, further comprising at least one suction pump connected to the respective chamber that is configured for pumping fluid out of the respective chamber interior.

9. The arrangement as claimed in claim 8, wherein the at least one suction pump respectively has at least one inlet valve that is connected to the respective chamber and is configured to admit fluid into the respective chamber interior.

10. The arrangement as claimed in claim 1, wherein the switching valves each include a respective switching valve closure member, and the switching valve closure member of the respective switching valve, is arranged at least regionally in the respective separating wall for closing off the respective auxiliary opening.

11. A method for operating an arrangement as claimed in claim 8, the method comprising, for pumping fluid out of the valve housing interior, bringing one of the respective auxiliary openings to an open state by the respective switching valve assigned thereto, and pumping the fluid, through the respective auxiliary opening and the respective chamber interior, out of the respective valve housing interior by the at least one suction pump connected to the respective chamber, and for pressure equalization between one of the chamber interiors and the valve housing interior, bringing the respective auxiliary opening arranged therebetween to the open state by the respective switching valve assigned thereto.

* * * * *